United States Patent [19]

Malhi

[11] Patent Number: 5,393,999
[45] Date of Patent: Feb. 28, 1995

[54] SIC POWER MOSFET DEVICE STRUCTURE

[75] Inventor: Satwinder Malhi, Garland, Tex.

[73] Assignee: Texas Instruments Incorporated, Dallas, Tex.

[21] Appl. No.: 257,500

[22] Filed: Jun. 9, 1994

Related U.S. Application Data

[63] Continuation of Ser. No. 21,006, Feb. 22, 1993, abandoned.

[51] Int. Cl.$^6$ .................. H01L 29/10; H01L 29/78; H01L 29/161; H01L 29/20
[52] U.S. Cl. ........................... 257/289; 257/77; 257/401; 257/412; 257/613
[58] Field of Search ............... 257/77, 289, 328, 412, 257/613, 744, 341, 401

[56] References Cited

U.S. PATENT DOCUMENTS

| | | | |
|---|---|---|---|
| 5,229,625 | 7/1993 | Suzuki et al. | 257/744 |
| 5,233,215 | 8/1993 | Baliga | 257/77 |

FOREIGN PATENT DOCUMENTS

| | | | |
|---|---|---|---|
| 2557727 | 7/1985 | France | 257/289 |
| 3-222367 | 10/1991 | Japan . | |
| 2082385 | 3/1982 | United Kingdom | 257/341 |

OTHER PUBLICATIONS

J. W. Palmour, et al. "Characterization of Device Parameters in High-Temperature Metal-Oxide-Semiconductor field-effect transistors in β-SiC Thin Films", 26 Apr. 1988, extracted from: *J. Appl. Phys.* 64(4), 15 Aug. 1988, pp. 2168-2177.

Robert F. Davis, et al. "Thin Film Deposition and Microelectronic and Optoelectronic Device Fabrication and Characterization in Monocrystalline Alpha and Beta Silicon Carbide", extracted from: IEEE vol. 79, No. 5, May 1991, pp. 677-701.

K. Furukawa, et al. "Insulated-Gate and Junction-Gate FET's of CVD-Grown β-SiC", extracted from: IEEE vol. EDL-8, No. 2, Feb. 1987, pp. 48-49.

K. Shibahara, et al. "Inversion-Type N-Channel MOSFET Using Antiphase-Domain Free Cubic-SiC Grown on Si(100)" extracted from: (1986 International) Conference on Solid State Device and Materials, Tokyo, 1986, pp. 717-720.

*Primary Examiner*—J. Carroll
*Attorney, Agent, or Firm*—Kay Houston; Richard A. Stoltz; James C. Kestersom

[57] ABSTRACT

A MOSFET (100) device having a silicon carbide substrate (102) of a first conductivity type. A first epitaxial layer (104) of said first conductivity type and a second epitaxial layer (106) of a second conductivity type are located on a top side of the substrate (102). An insulator layer (108) separates gate electrode (112) from second epitaxial layer (106). A drift region (118) of the first conductivity type is located within the second epitaxial layer (106) on the first side of the gate electrode (112). The drift region has an extension which extends through the second epitaxial layer (106) to the first epitaxial layer (104). Source regions (116) and body contact regions (122) are located within the second epitaxial layer (106) on the second side of the gate electrode (112). Source regions (116,) and body contact regions (122) are of opposite conductivity type. Source electrode (126) electrically connects source regions (116) and body contact regions (122). A drain electrode (128) is located on a bottom side of the substrate.

13 Claims, 4 Drawing Sheets

SIC POWER MOSFET DEVICE STRUCTURE

This application is a continuation of application Ser. No. 08/021,006, filed Feb. 22, 1993, abandoned.

FIELD OF THE INVENTION

This invention generally relates to semiconductor devices and processes and more specifically to power MOSFETs.

BACKGROUND OF THE INVENTION

A growing segment of the semiconductor business is high voltage/high power devices and integrated circuits. A critical element in this business is the power MOSFET. Power MOSFETs have many diverse applications in automotive, communications, consumer, data processing, industrial and military markets. For example, power MOSFETs may be used as drivers for motors, lamps, or displays. Most power MOSFETs are built in silicon. However, the performance of power MOSFETs built in silicon are already close to their theoretical limits. Therefore, research efforts have turned to silicon carbide (SIC) wafers. SiC has the potential for significantly (as much as two orders of magnitude) higher performance power MOSFETs compared to silicon wafers. However, one of the limitations in using SiC is that the wafer size is much smaller than traditional silicon wafers. SiC wafers have been limited to approximately 1 inch diameters. This inhibits their use or production in existing silicon wafer fabrication facilities built to handle large wafers.

A typical prior art MOSFET built using silicon carbide (SIC) is shown in FIG. 1. The device 10 has a p-type epitaxial layer 14 adjacent a p-type SiC substrate 12. The MOSFET channel 16 was built in a 1.2 $\mu$m thick n-type $\beta$-SiC epitaxial layer. A polysilicon annular gate electrode 18 was used. Source/drain regions 20 were implanted at 773K and contacted with tantalum silicide (TaSi2) 22 which was annealed at 1173K. The depletion threshold voltage was $-12.9$V and the device 10 operated up to a drain voltage of 25V at temperatures up to 923K.

SUMMARY OF THE INVENTION

Generally, and in one form, a method of forming a MOSFET device having a silicon carbide substrate of a first conductivity type is disclosed. A first region of the first conductivity type is epitaxially grown on a first surface of the silicon carbide substrate. A second region of a second conductivity type is epitaxially grown adjacent the first region. A first conductive layer is formed above the second region. The first conductive layer is then etched to form a gate electrode. Third and fourth regions are then implanted with a first conductivity type dopant, wherein the third region is formed on a first side of the gate electrode and the fourth region is formed on a second side of the gate electrode. A first portion of the third region is implanted with the first conductivity type dopant such that the first portion extends through the second region to the first region. A fifth region is implanted with a dopant of a second conductivity type adjacent the fourth region.

An advantage of the invention is providing an improved high voltage device.

A further advantage of the invention is providing an improved high voltage silicon carbide device that does not require a high temperature anneal.

A further advantage of the invention is providing an improved silicon carbide MOSFET having a metalization scheme that is capable of handling higher currents.

Other advantages will be apparent to those having ordinary skill in the art having reference to the following specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 2:
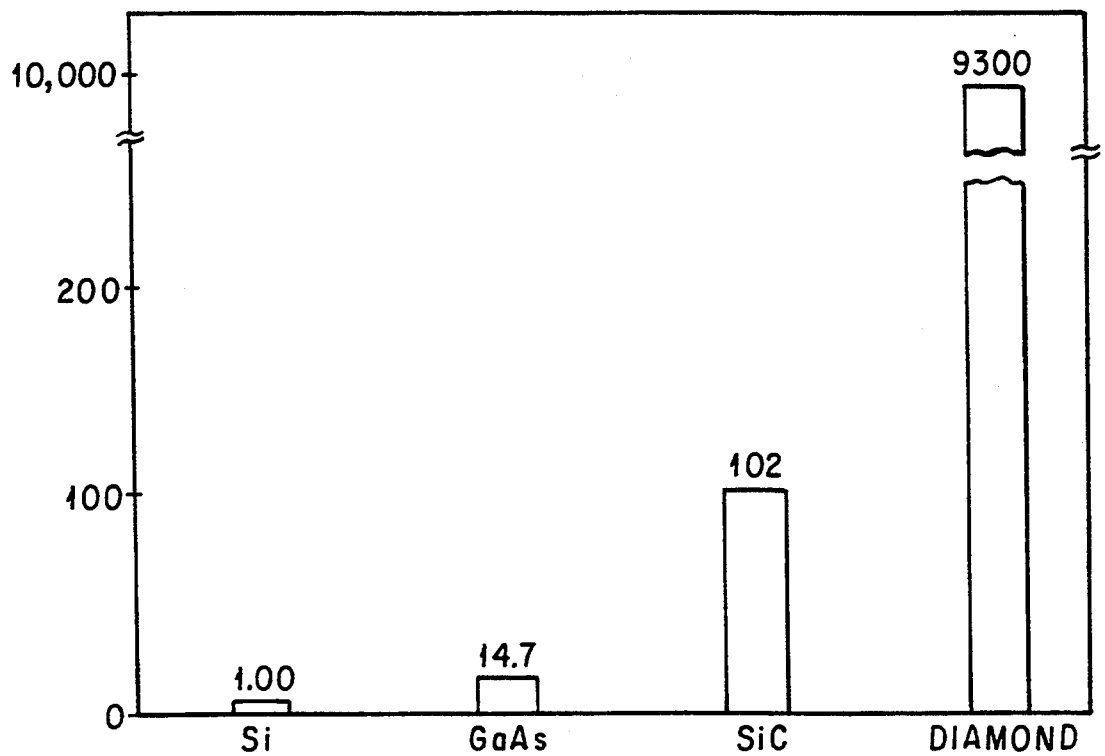
FIG. 2 is a plot of 1/Rsp characteristics for various materials.

The power MOSFET is a switch, much like an electromechanical relay is a switch, but it is much smaller, more reliable, and can be electronically controlled. The key performance figure for the power MOSFET is specific on-resistance (Rsp), or the resistance of this switch per unit die area when the device is switched on. A goal in power MOSFET technology is reducing the specific on-resistance as much as possible. This leads to 1/Rsp as a convenient figure of merit which should be maximized. The Rsp, depends on the semiconductor material properties, and the figure of merit can be written as $$\text{FIGURE OF MERIT} = 1/\text{Rsp} \sim = \epsilon^* \, \mu^* \, \text{Ec}^3$$

where $\epsilon$ is the dielectric constant, $\mu$ is the carrier mobility, Ec is the avalanche electric field. Table 1 lists the properties of a few candidate materials and FIG. 2 plots the 1/Rsp figure of merit.

TABLE 1

| Parameter | Symbol | Units | Si | SiC |
|---|---|---|---|---|
| Relative Dielectric Constant | $\epsilon$ | C/V.cm | 11.8 | 9.7 |
| Mobility | $\mu$ | cm$^2$/V.sec | 1400 | 300 |
| Critical Field | $E_c$ | V/cm | $3 \times 10^5$ | $2.5 \times 10^6$ |
| Figure of Merit Factor | $\epsilon^*\mu^*Ec^3$ | — | $4.46 \times 10^{20}$ | $4.55 \times 10^2$ |
| Relative Figure of Merit | — | — | 1 | 102 |

SiC has the potential of 100 X higher performance compared to Si power MOSFETS. It can be oxidized to form high quality silicon dioxide (SiO2) to serve as gate insulator. SiC wafers are commercially available. This material can be processed in the same wafer fabrication facilities that produce silicon devices without any cross-contamination problem. This is very important since new dedicated wafer fabrication facilities require huge capital investment.

Figure 1:
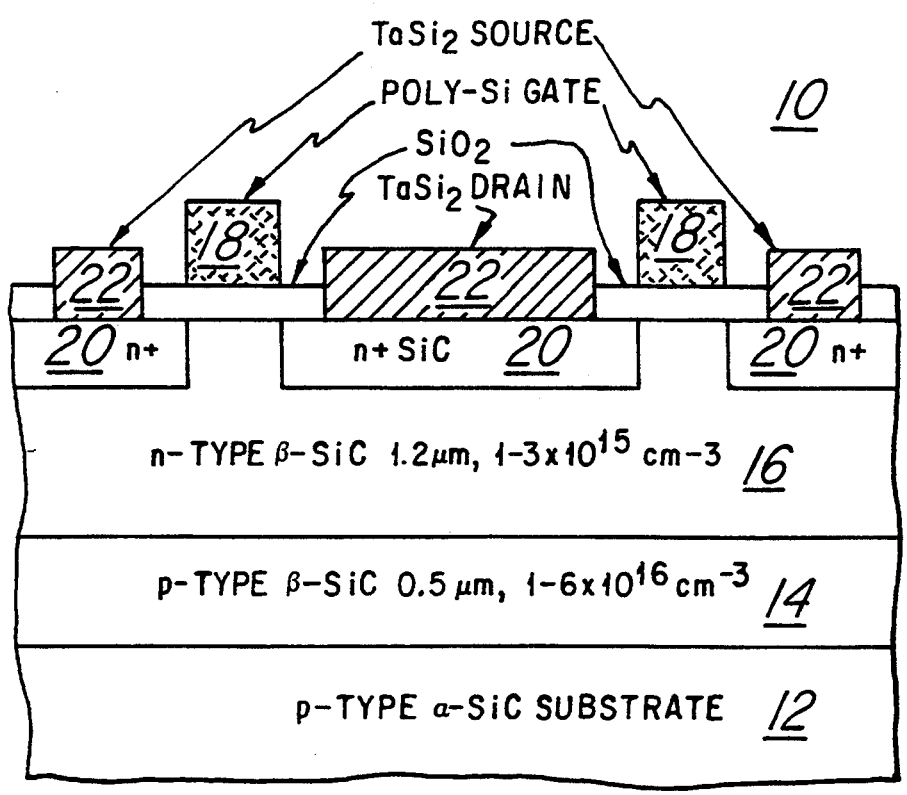
FIG. 1 a cross-sectional view of a prior art MOSFET built in SiC.

Prior art SiC MOSFETs, such as that shown in FIG. 1, require a high temperature implant and anneal to form source/drain regions 20. Diffusion of dopants in SiC is extremely slow. Accordingly, anneals at temperatures on the order of 1800°–1900° C. are required. This temperature requirement exceeds the capability of most existing wafer fabrication equipment. One method of reducing the temperature required for an anneal is to increase the temperature at which the implant is performed. Unfortunately, implant temperatures on the order of 500°–700° C. are then required. These temperature requirements also exceeds the capability of most existing wafer fabrication equipment. Accordingly, a device is needed which eliminates the high temperature requirements of prior art devices.

Figure 3:
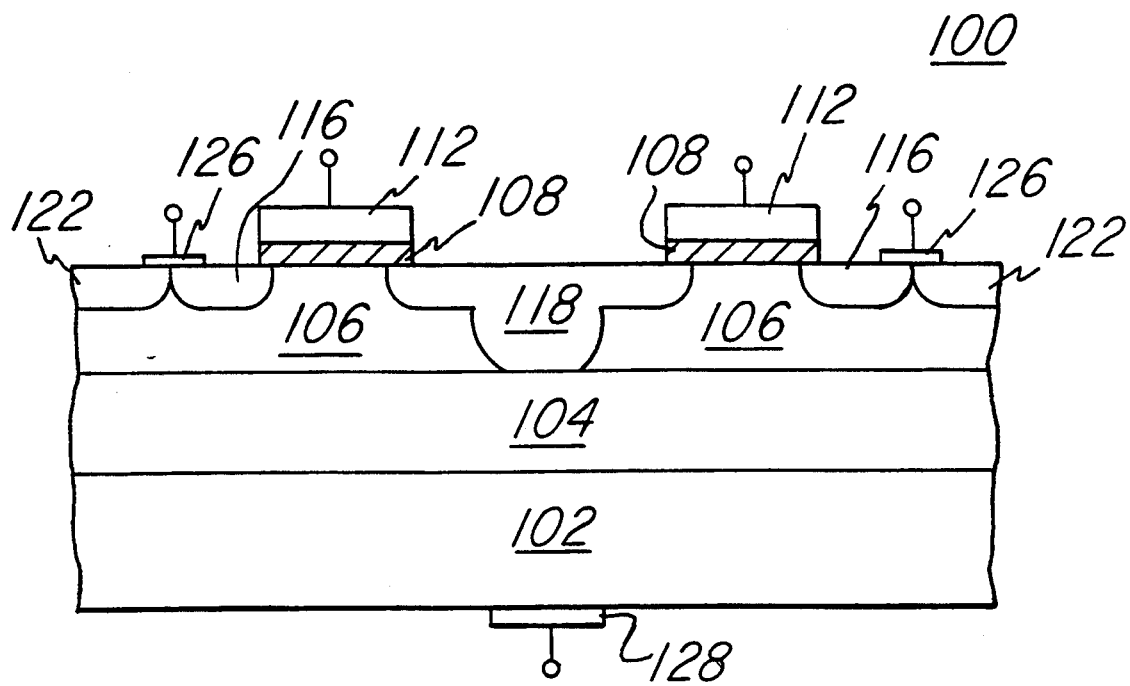
FIG. 3 is a cross-sectional view of the preferred embodiment of the invention.

The preferred embodiment of the invention will now be described with reference to an n-channel inversion-mode power MOSFET. It will be apparent to those skilled in the art that the invention may also be used for p-channel MOSFETs. Referring to FIG. 3, MOSFET 100 contains a substrate 102 which may, for example, comprise n-type 6H-SiC. N-type epitaxial layer 104 is located adjacent substrate 102. P-type epitaxial layer 106 is located above n-type epitaxial layer 104. Source regions 116 and body contact regions 122 are located in the surface of p-type epitaxial layer 106. Source regions 116 and body contact regions 122 are shorted together via source electrode 126. Gate electrode 112 is separated from p-type epitaxial layer 106 by insulator layer 108. Gate electrode 112 may, for example, comprise polysilicon, or monocrystalline, micro-crsytalline or polycrystalline SiC and insulator layer 108 may, for example comprise silicon dioxide (SiO2). Drain electrode 128 is located on the opposite side of substrate 102 from n-type epitaxial layer 104. Placing drain electrode 128 on the bottom side of the substrate 102, allows for a much simpler metalization scheme to be implemented on the top side because only source 126 and gate 112 electrodes exist on the top side. A simple metalization scheme is especially important in high power/high current devices. Drift region 118 is located on the opposite side of gate electrode 112 from source regions 116. A portion of drift region 118 extends through p-type epitaxial layer 106 to n-type epitaxial layer 104. In operation, when a voltage is applied to gate electrode 112, current will flow from drain electrode 128 through substrate 102, n-epitaxial layer 104, drift region 118, and n-type inversion layer (not shown) on p-type epitaxial layer 106 (which provides a lateral channel) to source regions 116 and body contact regions 122.

Figure 4A:
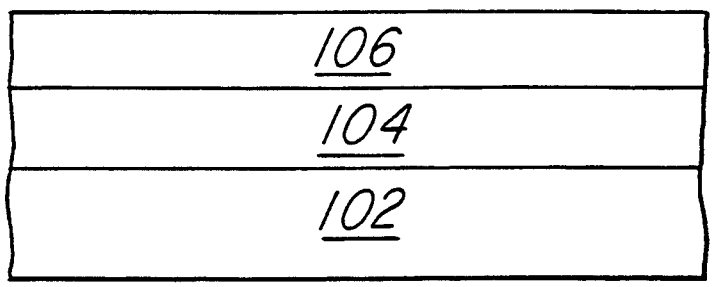
FIGS. 4a–g are cross-sectional views illustrating various states of fabrication of the preferred embodiment of the invention.

The preferred method for forming MOSFET 100 will now be described with reference to FIGS. 4a–g. Referring to FIG. 4a, n-type epitaxial layer 104 is formed on substrate 102 by, for example, chemical vapor deposition (CVD). Other methods, such a molecular beam epitaxy (MBE), will be apparent to those skilled in the art. Then, p-type epitaxial layer 106 is formed on n-type epitaxial layer 104. CVD may also be used to form p-type epitaxial layer 106.

Figure 4B:
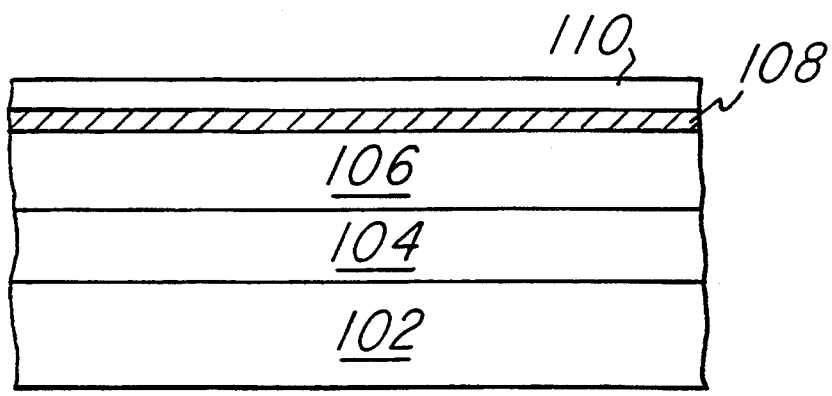
Figure 4C:
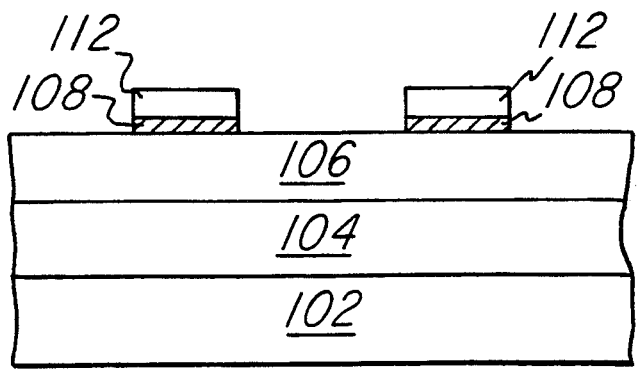

Referring to FIG. 4b, insulator layer 108 is thermally grown on the surface of p-epitaxial layer 106. Other methods or forming insulator layer 108 will be apparent to those skilled in the art. Conductive layer 110 is deposited on the surface of insulating layer 108. Conductive layer 110 and insulating layer 108 are then patterned and etched to form gate electrode 112, as shown in FIG. 4c.

Figure 4D:
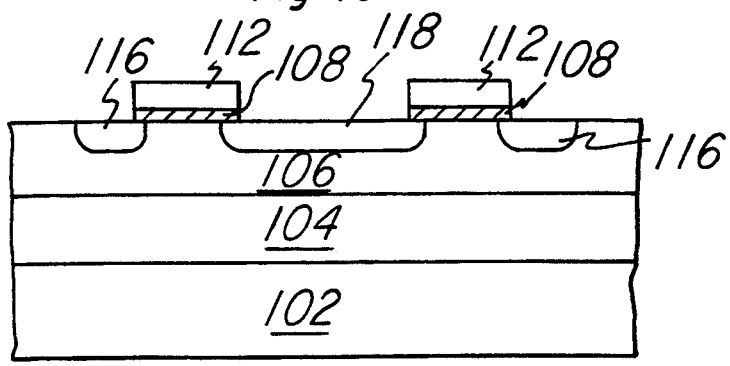
Figure 4E:
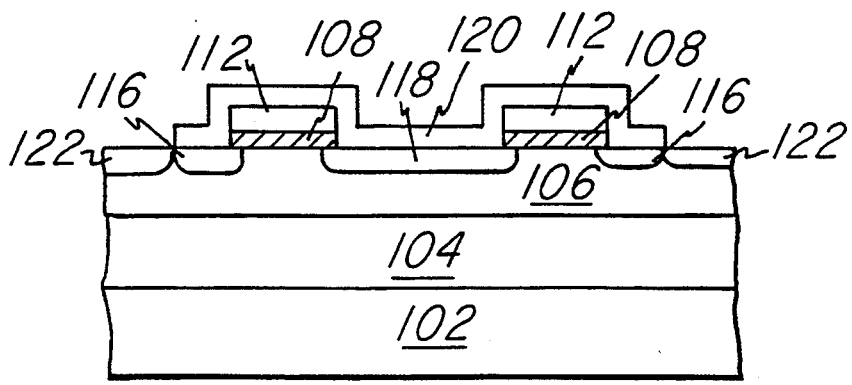
Figure 4F:
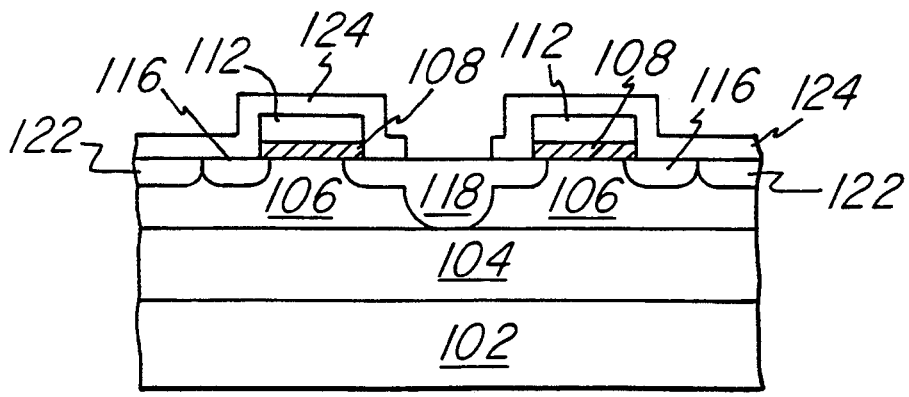

Referring to FIG. 4d, source regions 116 and drift region 118 are then implanted successively using two separate masks and different doses of a dopant such as phosphorous. A third masking layer 120 is deposited, patterned and etched, as shown in FIG. 4e, to expose portions of p-type epitaxial layer 106 wherein body contact regions 122 are to be formed. These regions 122 are then implanted using a dopant, such as boron. Third masking layer 120 is then removed and a fourth masking layer 124 is deposited, patterned and etched, as shown in FIG. 4f, to expose a portion of drift region 118. Drift region 118 is implanted a second time with phosphorus such that a portion of drift region 118 extends through p-type epitaxial layer 106 to n-type epitaxial layer 104. Fourth masking layer 124 is then removed. Drift region 118, source regions 116 and body contact regions 122 are then annealed. A high quality anneal is not required because there is no p-well and the n-type source region 116 will be electrically shorted to the p-type body contact regions 122. The p-type region in the current path between drift region 118 and source region 116 is a p-type epitaxial layer 106 instead of an implanted layer. This allows a high quality inversion layer to be acheived.

Figure 4G:
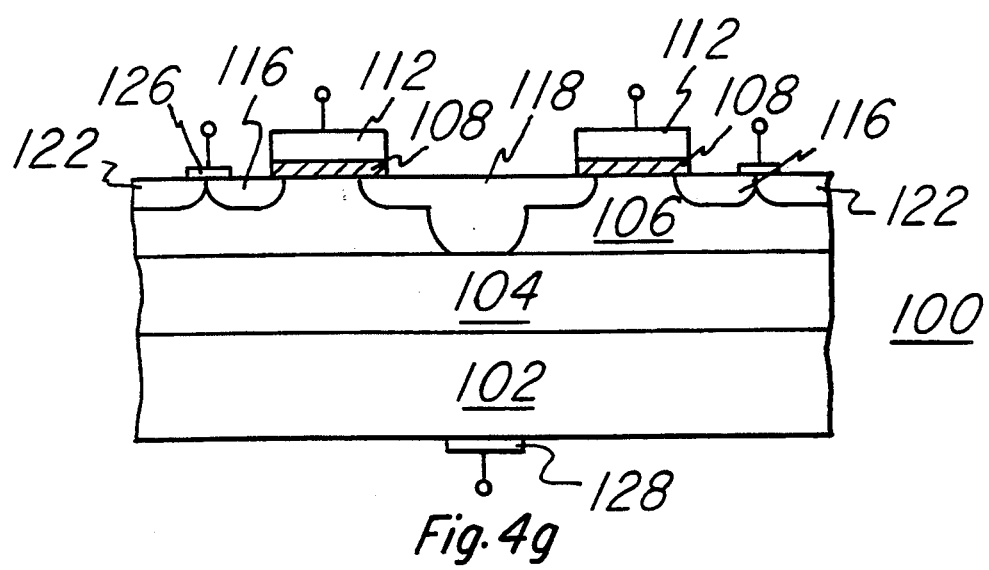

Finally, as shown in FIG. 4g, source electrodes 126 are formed by depositing, patterning and etching a layer of conducting material on the surface of device 100. Drain electrode 128 is similarly formed by depositing, patterning, and etching a layer of conductive material on the bottom side of device 100. Source electrodes 126 and drain electrode 128 may, for example, comprise nickel. Other suitable materials, such as tantalum silicide, will be apparent to those skilled in the art.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
    a. a substrate of a first conductivity type comprising silicon carbide;
    b. a first epitaxial layer of a second conductivity type located on a top side of said substrate with a lateral channel in a portion of said first epitaxial layer;
    c. a gate electrode located above said first epitaxial layer, said gate electrode having a first side and a second side;
    d. a drift region of said first conductivity type located within said first epitaxial layer on said first side of said gate electrode, said drift region having an extension which extends through said first epitaxial layer;
    e. a source region located within said first epitaxial layer on said second side of said gate electrode, wherein said source region is of said first conductivity type; and
    f. a drain electrode located on bottom side of said substrate.

2. The device of claim 1 further comprising a second epitaxial layer of said first conductivity type located between said substrate and said first epitaxial layer.

3. The device of claim 1 further comprising an insulator layer located between said gate electrode and said first epitaxial layer.

4. The device of claim 1 further comprising a body contact region, wherein said body contact region is of said second conductivity type.

5. The device of claim 4 further comprising a source electrode located above said source region and said body contact region such that said source region and said body contact regions are electrically connected.

6. The device of claim 4 wherein said source electrode and said drain electrode comprise nickel.

7. The device of claim 1, wherein said first conductivity type is n-type and said second conductivity type is p-type.

8. The device of claim 1, wherein said gate electrode comprises polysilicon.

9. The device of claim 1, wherein said gate electrode comprises a material selected from the group of monocrystalline, microcrystalline, and polycrystalline silicon carbide.

10. A MOSFET device comprising:
  a. a substrate of a first conductivity type comprising silicon carbide;
  b. a first epitaxial layer of said first conductivity type located on a top side of said substrate;
  c. a second epitaxial layer of a second conductivity type located adjacent said first epitaxial layer with a lateral channel in a portion of said second epitaxial layer;
  d. an insulator layer located adjacent said second epitaxial layer;
  e. a gate electrode located adjacent said insulator layer, said gate electrode having a first side and a second side;
  f. a drift region of said first conductivity type located within said second epitaxial layer on said first side of said gate electrode, said drift region having a horizontal portion and a vertical extension which extends through said second epitaxial layer to said first epitaxial layer;
  a. a source region located within said second epitaxial layer on said second side of said gate electrode, wherein said source region is of said first conductivity type, and a body contact region located within said second epitaxial layer, wherein said body contact region is of said second conductivity type; and
  b. a source electrode located above said source region and said body contact region such that said source region and said body contact region are electrically connected; and
  c. a drain electrode located on a bottom side of said substrate.

11. The device of claim 10 wherein said source and drain electrodes comprise nickel.

12. The device of claim 10, wherein said first conductivity type is n-type and said second conductivity type is p-type.

13. The device of claim 10, wherein said gate electrode comprises a material selected from the group of polysilicon, and mono-crystalline, micro-crystalline, and polycrystalline silicon carbide.

* * * * *